United States Patent [19]

Gabriel

[11] 4,366,187
[45] Dec. 28, 1982

[54] IMMERSION CURING OF ENCAPSULATING MATERIAL

[75] Inventor: William Gabriel, Andover, Mass.

[73] Assignee: Western Electric Company, Inc., New York, N.Y.

[21] Appl. No.: 202,860

[22] Filed: Oct. 31, 1980

[51] Int. Cl.³ .................................................. B05D 5/12
[52] U.S. Cl. ..................................... 427/96; 427/231; 427/238; 427/341; 427/379; 427/387
[58] Field of Search ............... 156/329, 285; 427/96, 427/341, 231, 238, 379, 387; 528/901

[56] References Cited

U.S. PATENT DOCUMENTS

| | | | |
|---|---|---|---|
| 3,108,898 | 10/1963 | Nitzsche et al. | 156/329 |
| 3,151,099 | 9/1964 | Ceyzeriat et al. | 528/901 |
| 3,258,382 | 6/1966 | Vincent | 156/329 |
| 3,294,739 | 12/1966 | Weyenberg | 528/901 |
| 3,304,201 | 2/1967 | Boehm | 427/341 |
| 3,629,228 | 12/1971 | Hartlein et al. | 156/329 |
| 3,896,077 | 7/1975 | Leonard et al. | 156/285 |
| 4,035,355 | 7/1977 | Baney et al. | 156/329 |
| 4,163,072 | 7/1979 | Soos | 427/96 |

Primary Examiner—Norman Morgenstern
Assistant Examiner—Richard Bueker
Attorney, Agent, or Firm—D. D. Bosben

[57] ABSTRACT

A method of curing a layer of RTV encapsulating material (24) disposed between a substrate (20) and a chip carrier (22), without the formation of voids in the material immediately adjacent opposed surfaces (32 and 34) of the substrate and the chip carrier, respectively, initially involves cleaning the substrate-chip carrier assembly (20-22) with an activating solvent (e.g., xylene), after which the assembly is blow-dried. The encapsulating material (24), having a viscosity on the order of 6-9 poise, then is flowed between the substrate (20) and the chip carrier (22) and a layer of the material also may be flowed over the top of the assembly. The assembly (20-22) next is immersed in a water bath (46), which includes on the order of 10 milliliters of water for each cubic centimeter of the material (24) to be cured, at room temperature under a hydrostatic head on the order of 3-4 inches for on the order of 16 hours or more, while the material cures. The assembly (20-22) subsequently is air-dried for on the order of 1-3 hours and then the material is heat-cured for on the order of two hours at on the order of 120° C.

11 Claims, 17 Drawing Figures

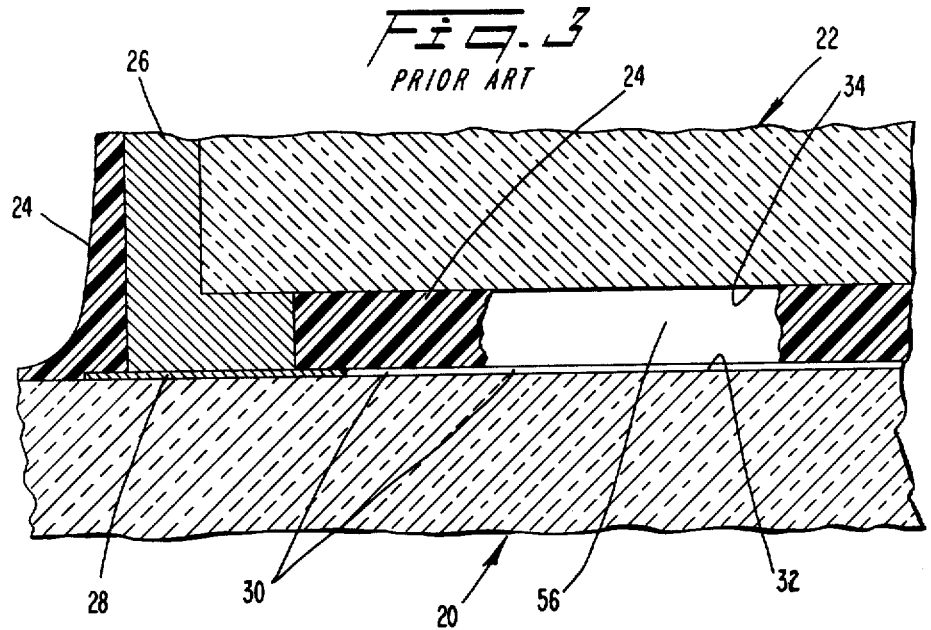
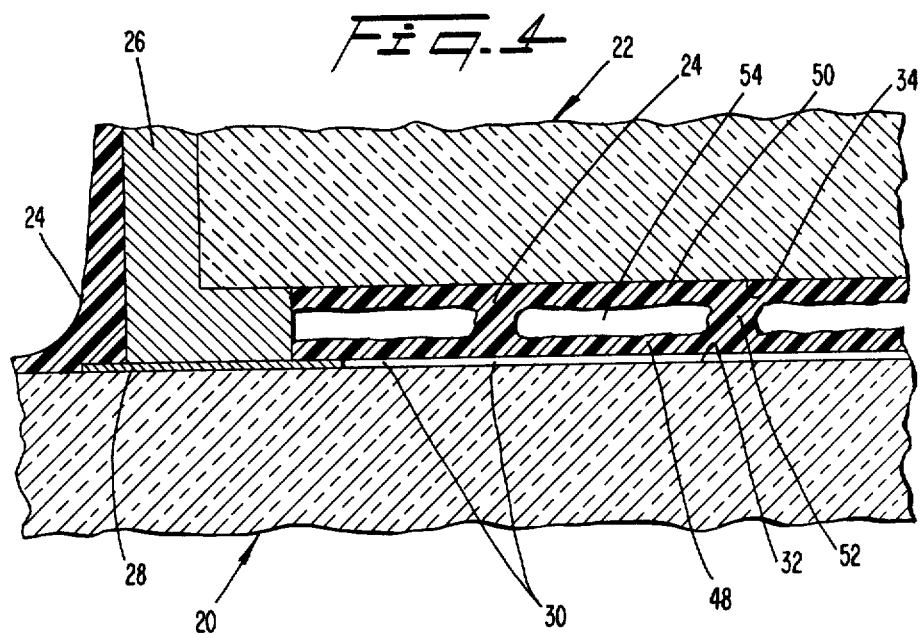

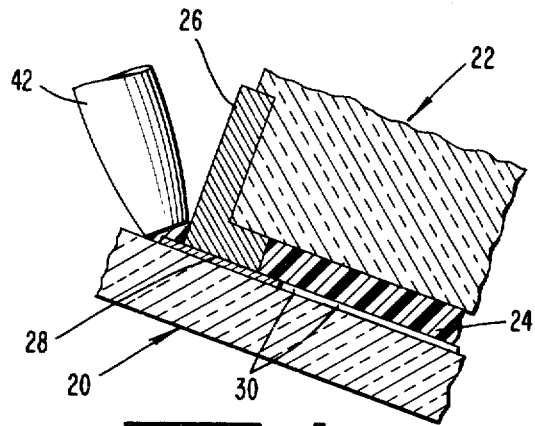
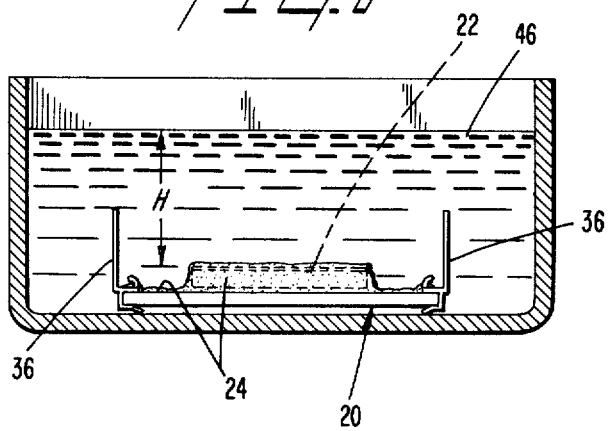

Fig.8
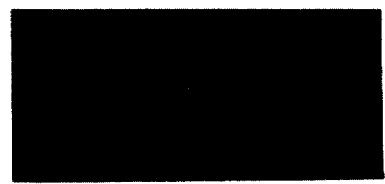
Fig.9
Fig.10
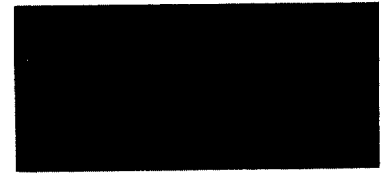
Fig.11
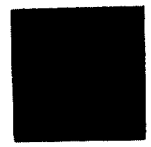
Fig.12
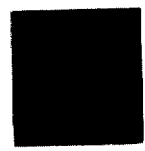
Fig.13

IMMERSION CURING OF ENCAPSULATING MATERIAL

TECHNICAL FIELD

This invention relates to the immersion curing of encapsulating material, and more particularly to the water-immersion curing of a room temperature vulcanizing (RTV) material disposed between a chip carrier and a substrate without the formation of voids in the material immediately adjacent opposed surfaces of the chip carrier and the substrate.

BACKGROUND OF THE INVENTION

In the mounting of electrical circuit devices, such as a ceramic carrier for an integrated circuit silicon chip, on a ceramic substrate having thin or thick film integrated circuits formed thereon, the chip carrier generally is mounted on the substrate so that the chip carrier is slightly elevated with respect to the substrate, such as on the order of 5–20 mils. The mounting of the chip carrier on the substrate is accomplished by bonding leads of the chip carrier extending down the sides thereof, to contact pads on the substrate. It then is necessary to cover circuitry on the substrate beneath the chip carrier with a void-free protective coating, such as a self-curing RTV encapsulating material comprised essentially of silicone rubber. If the undersurface of the chip carrier facing the substrate also is provided with thin or thick film integrated circuits, it then becomes essential that this surface also be covered with a void-free protective coating of the encapsulating material. The void free coatings prevent moisture films from forming on the substrate and/or the chip carrier, the moisture films being undesirable because they cause leakage currents between adjacent circuit elements of the substrate and/or the chip carrier, and/or corrosion of the circuit elements.

In a known process for encapsulating one or more integrated circuit silicon chips mounted directly on a substrate, without a chip carrier, encapsulating material is flowed between the chips and the substrate, and over the substrate-chip assembly. The encapsulated substrate-chip assembly then is placed in a vacuum for one minute, to draw air bubbles out of the RTV encapsulating material. The encapsulated assembly then is air-dried and partially cured for two hours, after which the RTV encapsulating material is heat-cured for three hours at 120° C.

An encapsulating method as above-described has worked satisfactorily in the past since the silicon chips, which did not require carriers, generally were relatively small in size, not exceeding 0.100 inches square, and generally were spaced from the substrate on the order of only up to 5 mils. When this method is used with chip carriers, however, which have dimensions up to on the order of 0.700 inches square, and which are spaced from the substrate up to on the order of 20 mills, the RTV encapsulating material tends to develop voids under the chip carrier, producing surface areas of the substrate and/or the chip carrier which are not covered by encapsulating material. This is undesirable because at least one mil of encapsulating material over any circuit elements on these surfaces is considered essential to provide proper protection of the circuit elements against the subsequent formation of moisture films which could produce detrimental leakage currents between the circuit elements and/or corrosion of the circuit elements as above-described.

In this connection, it also has been suggested that more reliable results can be achieved if the opposed surfaces of the substrate and the chip carrier initially are coated with thin layers of encapsulating material with an air gap between the coated surfaces. Otherwise, such as where the entire space between the chip carrier and the substrate is filled with encapsulating material, as the encapsulating material shrinks during curing it tends to pull away from the chip carrier and substrate surfaces, exposing them to moisture films as noted above.

A problem has existed, however, in coating the opposed surfaces of the chip carrier and the substrate with the thin layers of encapsulating material separated by an air gap, and various systems have been proposed for this purpose. For example, the encapsulating material has been blown into the space between the chip carrier and the substrate by a jet stream at high velocity, causing a thin film of encapsulating material to be deposited on the chip carrier and substrate opposed surfaces, with the excess encapsulating material therebetween being blown away by the jet stream. The chip carrier and the substrate, with the space therebetween filled with encapsulating material, also have been subjected to a spinning operation, causing the excess encapsulating material to be thrown out of the space between the chip carrier and the substrate by centrifugal force.

In conjunction with the foregoing coating processes utilizing blowing of the RTV encapsulating material between the substrate and the chip carrier, or spinning of the substrate-chip carrier assembly, it also has been proposed that the substrate-chip carrier assembly initially be cleaned with a solvent, such as xylene, for activating curing of the RTV encapsulating material. The substrate-chip carrier assembly then in blow-dried and the RTV encapsulating material is applied between the substrate and chip carrier as above described, and about the sides of the chip carrier. The partially encapsulated substrate-chip carrier assembly then is placed in a vacuum for one minute, after which the entire substrate-chip carrier assembly is flow-coated with the RTV encapsulating material. The encapsulated substrate-chip carrier assembly then is successively dried in a nitrogen atmosphere for 6 hours, and in air for 3 hours (spinning process) or 40 hours (blowing process), and finally heat-cured at 120° for 2 hours (spinning process) or 3 hours (blowing process). However, neither of these proposed processes has yet been proven entirely satisfactory for the intended purpose.

Accordingly, a primary purpose of this invention is to provide a new and improved, relatively simple method of encapsulating a chip carrier mounted on a substrate, without the formation of voids in the encapsulating material adjacent opposed surfaces of the chip carrier and the substrate.

SUMMARY OF THE INVENTION

In general, a method of curing a layer of encapsulating material which is disposed between opposed surfaces of two articles, without the formation of voids adjacent at least one of the opposed surfaces, involves immersing the two articles and the encapsulating material therebetween in a liquid as the encapsulating material cures.

More specifically, in a method of encapsulating an assembly including an electrical device mounted on a substrate, the substrate-electrical device assembly is washed with a solvent capable of activating the curing of an RTV encapsulating material, and the substrate-electrical device assembly is blow-dried. An RTV encapsulating material having a viscosity on the order of 6–9 poise then is flowed between the electrical device and the substrate, whereupon additional material may be flowed over the top of the chip carrier and the substrate. The encapsulated substrate-electrical device assembly next is immersed in a water bath at room temperature under a hydrostatic head of on the order of 3–4 inches for on the order of at least 16 hours as the RTV encapsulating material cures. Preferably, the volume of water to the volume of RTV encapsulating material is on the order of at least 10 milliliters of water per cubic centimeter of encapsulating material. Subsequently, the encapsulating material is air-dried for on the order of 1–3 hours and then heat-cured on the order of 2 hours at on the order of 120° C.

BRIEF DESCRIPTION OF THE DRAWING

FIG. 3 is an enlarged cross-sectional view, illustrating an encapsulating material condition which the subject invention eliminates;

FIG. 4 is an enlarged cross-sectional view similar to FIG. 3, illustrating an encapsulating material condition produced utilizing the subject invention;

FIG. 5 is a schematic view illustrating a method step used in practicing the invention;

FIG. 6 is a schematic view illustrating another method step used in practicing the invention;

FIG. 7 is a block diagram illustrating a sequence of method steps used in practicing the invention;

FIG. 8 is an enlarged photograph of a glass substrate of a substrate-chip carrier assembly encapsulated utilizing a known prior art process;

FIG. 9 is an enlarged photograph of a glass substrate of a substrate-chip carrier assembly encapsulated in accordance with the process of this invention;

FIGS. 10 and 11 are enlarged photographs of encapsulating coatings formed on respective ceramic thin film substrates utilizing a known prior art process;

FIGS. 12 and 13 are enlarged photographs of encapsulating material coatings formed on respective chip carriers and associated substrates of substrate-chip carrier assemblies utilizing the subject invention, as viewed along a plane extending intermediate opposed surfaces of the chip carriers and the substrates;

DETAILED DESCRIPTION

Figure 1:
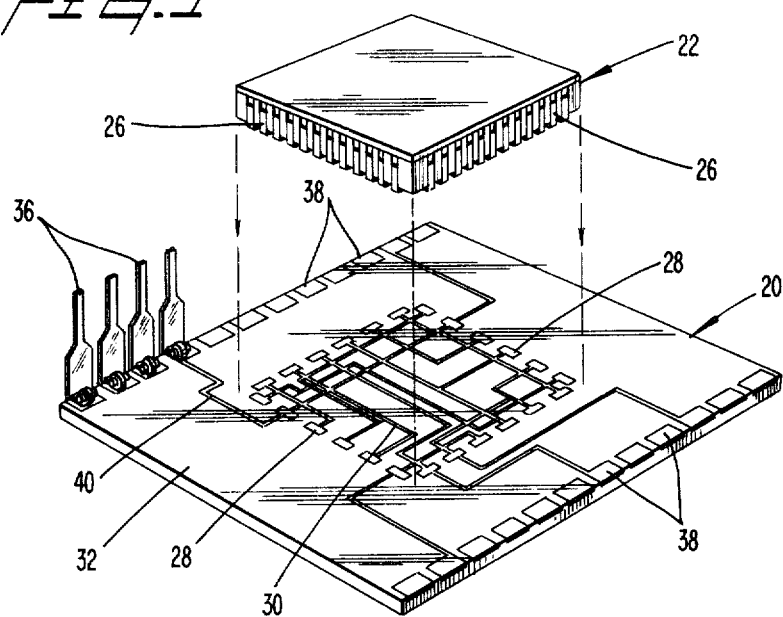
FIG. 1 is an isometric exploded view of a chip carrier and a substrate of a type with which the subject invention may be utilized.
Figure 2:
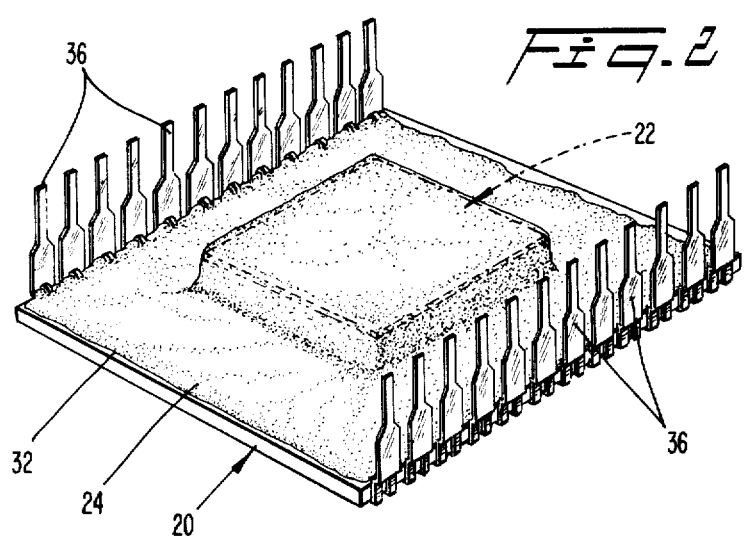
FIG. 2 is an isometric view of the chip carrier and substrate shown in FIG. 1, in assembled relationship and coated with an encapsulating material.

Referring to FIGS. 1 and 2, an embodiment of the invention disclosed herein is directed to the encapsulating of an electrical assembly, such as a substrate-chip carrier assembly comprising a ceramic substrate 20 and an electrical device in the form of a ceramic carrier 22 having an integrated circuit chip (not shown) mounted and hermetically sealed therein, in a room temperature vulcanizing (RTV) material 24, as shown in FIG. 2. The chip carrier 22 includes pins or leads 26 which have been bonded to contact pads 28 (FIG. 1) of a thin or thick film integrated circuit 30 formed on a surface 32 of the substrate 20, with an undersurface 34 (FIG. 4) of the carrier spaced from the substrate surface 32 a preselected distance, such as 5–20 mils. The substrate 20 also includes leads 36 which have been reflow-soldered to edge contact pads 38 (FIG. 1) on the substrate in a known manner, the contact pads 28 and 38 being interconnected by thin or thick film conductors 40 (FIG. 1). The encapsulation of the substrate-chip carrier assembly 20–22 includes coating of the integrated circuit 30 and the surface 32 of the substrate 20 with at least one mil of the RTV encapsulating material 24, as illustrated in FIG. 4, to prevent the subsequent collection of detrimental moisture films on the surface. The invention also may be utilized to coat the undersurface 34 of the chip carrier 22 in the same manner, as shown in FIG. 4, when the undersurface also has thin or thick film circuitry (not shown) formed thereon.

Referring to FIG. 7, in carrying out the invention the substrate-chip carrier assembly 20–22 initially is cleaned, preferably with a solvent such as xylene, which tends to activate the subsequently applied RTV encapsulating material 24. The substrate-chip carrier assembly 20–22 then is blow-dried in a normal manner.

Referring to FIGS. 5 and 7, the substrate-chip carrier assembly 20–22 next is mounted in a suitable fixture (not shown) at an angle on the order of 15° and the RTV encapsulating material 24 is dispensed and flowed between the substrate 20 and the chip carrier 22 from a dispensing nozzle 42. In this connection, the RTV encapsulating material 24 tends to be drawn into the space between the substrate 20 and the chip carrier 22 by capillary action. A layer of the RTV encapsulating material 24 then also may be applied over the top and about the sides of the chip carrier 22, and over the substrate 20, as illustrated in FIG. 2. Preferably, this layer of the RTV encapsulating material 24 is kept relatively thin in nature about the sides of the chip carrier 22 so that it does not interfere with the escape of xylene gas from the encapsulating material between the substrate 20 and the chip carrier during the curing of the encapsulating material.

Referring to FIGS. 6 and 7, in accordance with this invention the encapsulated substrate-chip carrier assembly 20–22 then is immersed in a bath 46 of a liquid, such as water, for a predetermined time period as the RTV encapsulating material 24 cures. Following this immersion-curing of the encapsulating material 24, the encapsulated substrate-chip carrier assembly 20–22 is air-dried and heat-cured in a known manner (FIG. 7). While the exact reasons are not understood, it has been found that when the encapsulating material 24 between the substrate 20 and the chip carrier 22 is cured in this manner, the encapsulating material forms a honeycomb-type pattern, leaving coatings 48 and 50 of the encapsulating material at least one mil thick over the integrated circuit 30 and the surface 32 of the substrate, and the surface 34 of the chip carrier, respectively, as illustrated in FIG. 4 and shown by the photographs of FIGS. 9, 12 and 13. More specifically, the coatings 48 and 50 are interconnected by webs 52 separated by intermediate voids 54, as illustrated in FIG. 4 and shown by the photographs of FIGS. 12 and 13. This is in contrast to results achieved by curing of the encapsulating material 24 in accordance with prior known practice, in which the encapsulating material tends to create voids 56 and to pull away from one or both of the respective surfaces 32 and 34 of the substrate 20 and the chip carrier 22 during curing, as illustrated in FIG. 3 and shown in the photographs of FIGS. 8, 10 and 11.

The parameters of the subject process may vary depending on the circumstances involved. However, in general, favorable results have been achieved using RTV encapsulating material 24 having a viscosity on the order of 6-9 poise, so that the encapsulating material can flow relatively freely onto the surfaces 32 and 34 of the substrate 20 and the chip carrier 22, respectively, without excessive thinning. In this regard, using a viscosity of 6 poise, void-free coatings on the substrate surfaces 32 have been attained by immersion-curing the partially encapsulated substrate-chip carrier assemblies 20-22 in the water bath 46 at room temperature for on the order of 16-24 hours under a hydrostatic head on the order of 3-4 inches, with a water volume on the order of 10 milliliters of water for each cubic centimeter of encapsulating material to be cured so that the bath does not become prematurely saturated with xylene escaping from the RTV encapsulating material 24 as the material cures. Void-free coatings on the undersurface 34 of the chip carriers 22, in addition to void-free coatings on the substrate surfaces 32, have been attained when the partially encapsulated chip carrier-substrate assemblies 20-22 have been immersion-cured under the same conditions for a longer period of time, such as up to 64 hours. Void-free coatings on the substrate surfaces 32 also have been achieved with a viscosity of 9 poise, a hydrostatic head of 3 inches and an immersion-cure time of 64 hours. Further, best results appear to be achieved when the water in the curing bath 46 is changed periodically to prevent the bath from becoming saturated with xylene escaping from the RTV encapsulating material 24 during the curing process.

While in the above-described embodiment of the invention, the substrate-chip carrier assembly 20-22 is coated with the RTV encapsulating material 24 as shown in FIG. 2 prior to immersion-curing of the encapsulating material, only the encapsulating material between the substrate 20 and the chip carrier 22 need be subjected to immersion-curing in accordance with the invention. Accordingly, it is considered within the purview of the invention to flow the RTV encapsulating material 24 between the substrate 20 and the chip carrier 22, and perhaps about the sides of the chip carrier, and then immersion-curing the thus partially encapsulated assembly 20-22. Following the immersion-curing step, the remainder of the assembly 20-22 may be coated with the RTV encapsulating material 24, after which the encapsulated assembly can be air-dried and heat-cured as described hereinabove.

With further reference to FIGS. 8 and 9, FIG. 8 is a photograph taken from a non-circuit side of an integrated circuit glass substrate 20 of a substrate-chip carrier assembly 20-22 which was partially encapsulated in a known manner by dispensing RTV encapsulating material 24 between the substrate and the chip carrier 22 (not visible in FIG. 8), subjecting the assembly to a vacuum, air-drying the assembly, and then heat-curing the encapsulating material. (In this instance, the substrate 20 shown is a sample on which the usual circuitry under the chip carrier 22 has not been formed). It is seen that the encapsulating material 24 is relatively light and splotchy in color, indicating a thin nonuniform coating on an opposite circuit side of the substrate 20. In contrast, in FIG. 9, which is a photograph taken from a non-circuit side of an identical integrated circuit glass substrate 20 of a substrate-chip carrier assembly 20-22 which was partially encapsulated in accordance with the immersion-cure process of this invention, the encapsulating material 24 is of a uniform dark gray color, indicating a thicker and more uniform coating on an opposite circuit side of the substrate.

With further reference to FIGS. 10 and 11, each of these figures shows a ceramic substrate 20 of a substrate-chip carrier assembly 20-22 which was encapsulated with RTV encapsulating material 24 utilizing the above described known prior art process used in partially encapsulating the glass substrate-chip carrier assembly of FIG. 8, and from which the chip carrier 22 (not shown) has been removed. (In this instance, the substrates 20 shown are samples on which film integrated circuits have not been formed). It is seen that the coating of encapsulating material 24 on the substrate beneath the chip carrier 22 in FIG. 10 included a large one of the above-mentioned voids 56 (see also FIG. 3), producing a large uncoated area (white portion) on the substrate 20. Similarly, the encapsulating material 24 on the substrate 20 in FIG. 11 also included a large one of the voids 56 and a number of smaller ones of the voids 56, producing several uncoated areas on the substrate. In contrast, in FIGS. 12 and 13, which each show a substrate 20 and a chip carrier 22 of a substrate-chip carrier assembly 20-22 which was encapsulated with RTV encapsulating material 24 utilizing the immersion-cure process of the subject invention, after which the substrate and the chip carrier were separated from one another by breaking the bonded connections of the chip carrier to the substrate and slicing through the webs 52 (see also FIG. 4) of the encapsulating material essentially along a plane intermediate the opposed surfaces of the chip carrier and the substrate, it is seen that the coatings of the encapsulating material on the opposed surfaces of the substrate and the chip carrier cover the entire surfaces. (In this connection, the white uncoated areas of the substrate 20 around the periphery of the area to which the chip carrier 22 had been bonded were caused by encapsulating material 24 being torn away from the substrate by the chip carrier during its removal from the substrate). In FIG. 12 the substrate-to-chip carrier spacing was 6 mils and in FIG. 13 the substrate-to-chip carrier spacing was 17 mils, indicating that the immersion-cure process of the invention works equally well for different substrate-to-chip carrier spacings.

Figure 14:
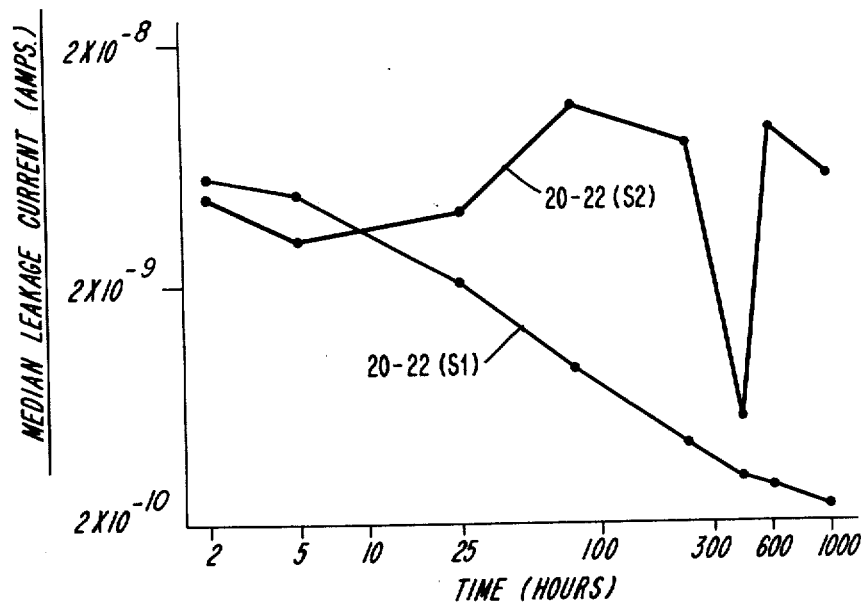
FIG. 14 is a chart illustrating median leakage currents in substrate-chip carrier assemblies encapsulated in accordance with the subject invention and a known prior art process.

FIG. 14 illustrates median leakage currents measured in two sets of ten assemblies 20-22 (S1) and 20-22 (S2) each consisting of a simulated chip carrier 20 (ceramic block) mounted on a ceramic thin film substrate 22 with a chip carrier-to-substrate clearance of 5 mils, with one set of the assemblies 20-22 (S1) having been encapsulated in accordance with the immersion-cure process of this invention, and the other assembly 20-22 (S2) having been encapsulated in accordance with the above-mentioned known prior art process. In each instance, RTV encapsulating material 24 was applied between the substrate 20 and the chip carrier 22 of each of the assemblies 20-22 (S1) and 20-22 (S2) in the same manner, by flowing the material from a dispenser such as the dispenser 42 in FIG. 5. The measurements were conducted in an environment having a temperature of 85° C. and a relative humidity of 85%, at 180 volts. The curves shown were obtained by plotting median values for each set of the assemblies 20-22 (S1) and 20-22 (S2), that is the average of the fifth and sixth ranked assemblies in each measurement.

It is seen from FIG. 14 that the substrate-chip carrier assemblies 20-22 (S1) encapsulated in accordance with the subject invention exhibited a slightly greater initial median leakage current than the substrate-chip carrier assemblies 20-22 (S2) encapsulated in accordance with the prior art method, but immediately began to exhibit a continuous downward trend in median leakage current with time. In contrast, the substrate-chip carrier assemblies 20-22 (S2) encapsulated using the prior art method exhibited a highly fluctuating, general increase in median leakage current with time.

Figure 15:
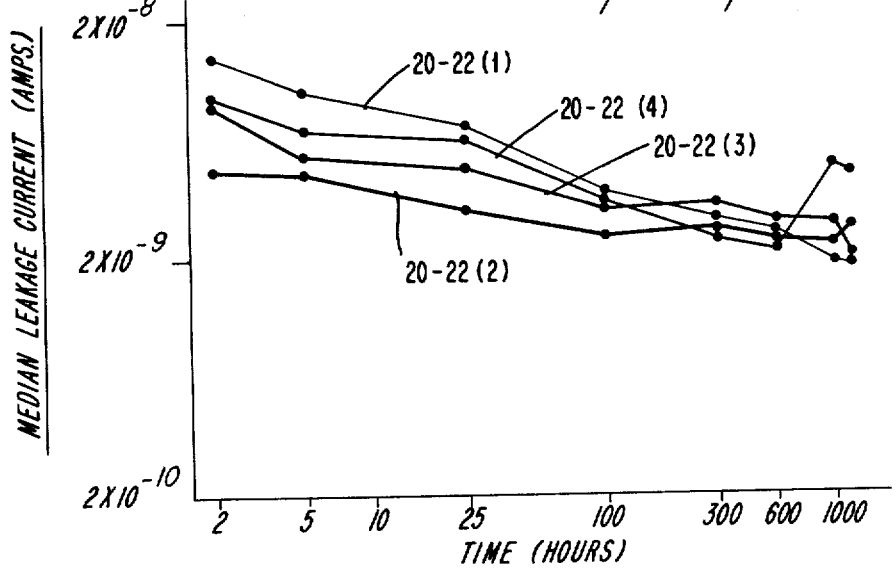
FIG. 15 is a chart illustrating median leakage currents in substrate-chip carrier assemblies encapsulated in accordance with the subject invention and several known prior art processes.

FIG. 15 illustrates median leakage currents measured in four sets of ten 48 pin (lead) substrate-chip carrier assemblies 20-22 (1), (2), (3) and (4) having a substrate-to-chip carrier spacing of 9-11 mils. The assemblies 20-22 (1) were encapsulated in accordance with the immersion-cure process of the subject invention and the assemblies 20-22 (2) were encapsulated in accordance with the above-mentioned known prior art process. The assemblies 20-22 (3) were encapsulated using a known process in which RTV encapsulating material 24 is blown between the substrates 20 and the chip carriers 22 to coat their respective opposed surfaces 32 and 34. The assemblies 20-22 (4) were encapsulated using a known method in which RTV encapsulating material 24 is flowed between the substrates 20 and the chip carriers 22 from a dispenser such as the dispenser 42 in FIG. 5, followed by spinning of the assemblies to remove excess material from between the substrates and the chip carriers by centrifugal force. As in the case of FIG. 14, the measurements were conducted in an environment having a temperature of 85° C. and a a relative humidity of 85%, at 180 volts, and the curves shown were obtained by plotting a median value for each set of the assemblies 20-22 (1), (2), (3) and (4) for each measurement taken.

It is seen in FIG. 15 that initially the median leakage current for the substrate-chip carrier assemblies 20-22 (1) encapsulated in accordance with the subject invention again was slightly greater than the median leakage current for the substrate-chip carrier assemblies 20-22 (2), (3) and (4) encapsulated in accordance with the prior art processes. However, with time the median leakage current in the substrate-chip carrier assemblies 20-22 (1) gradually decreased until at 600 hours the median leakage current in the three sets of assemblies 20-22 (1), (2) and (4) was essentially equal. The downward trend of the median leakage current in the substrate-chip carrier assemblies 20-22 (1) then continued, while the median leakage current in the substrate-chip carrier assemblies 20-22 (2) and 20-22 (4) subsequently increased in value. Similarly, after 300 hours the median leakage current for the assemblies 20-22 (1) was less than the median leakage current for the assemblies 20-22 (3).

In summary, a new and improved method of curing a layer of encapsulating material disposed between two articles, such as the RTV encapsulating material 24 disposed between the opposed surfaces 32 and 34 of the substrate 20 and the chip carrier 22, respectively, of the substrate-chip carrier assembly 20-22, has been disclosed. Referring to FIG. 7, the method includes the initial step of cleaning the substrate-chip carrier assembly 20-22 in an activating solvent, such as xylene, after which the assembly is blow-dried. The RTV encapsulating material 24, having a viscosity on the order of 6-9 poise, then is flowed between the substrate 20 and the chip carrier 22 from the dispenser 42 as illustrated in FIG. 5. A layer of the RTV encapsulating material 24 then is flowed over the top and around the sides of the chip carrier, and over the surface 32 of the substrate 20, as shown in FIG. 2. The encapsulated substrate-chip carrier assembly 20-22 next is immersed in the water bath 46 (FIG. 6), preferably at room temperature under a hydrostatic head on the order of 3-4 inches for on the order of 16 hours or more. The water bath 46 also preferably includes on the order of at least 10 milliliters of water for each cubic centimeter of the RTV encapsulating material 24 to be cured. After the RTV encapsulating material 24 of the encapsulated substrate-chip carrier assembly 20-22 has been immersion-cured in this manner, the assembly is air-dried for on the order of 1-3 hours and encapsulating material 24 is heat-cured for on the order of 2 hours at on the order of 120° C.

What is claimed is:

1. A method of forming a void-free coating over a film-type electrical conductor on a substrate wherein the substrate has been secured to an associated article with a fixed space between the substrate and the article, which comprises:
    flowing a layer of RTV material into the fixed space between the secured substrate and article in air so as to cover the film-type electrical conductor on the substrate;
    temporarily immersing the secured substrate and article, and the layer of RTV material therebetween, in a liquid as the RTV material cures, such that the RTV material forms the void-free coating over the film-type electrical conductor on the substrate; and
    subsequently removing the secured substrate and article, and the RTV material therebetween, from the liquid.

2. The method as recited in claim 1, in which the liquid is water.

3. The method as recited in claim 1, in which the secured substrate and article, and the RTV material therebetween, are temporarily immersed in the liquid for on the order of at least 16 hours.

4. The method as recited in claim 1, in which the secured substrate and article, and the RTV material therebetween, are temporarily immersed in the liquid under a hydrostatic head on the order of 3-4 inches.

5. The method as recited in claim 1, in which the volume of liquid to the volume of RTV material is on the order of at least 10 milliliters of liquid per cubic centimeter of RTV material.

6. The method as recited in claim 1, in which the RTV material has a viscosity on the order 6-9 poise.

7. The method as recited in claim 1, in which the RTV material is subsequently heat-cured at a temperature on the order of 120° C. for on the order of 2 hours.

8. The method as recited in claim 7, in which the RTV material is air-dried for on the order of 1-3 hours prior to being heat-cured.

9. The method as recited in claim 1, in which the secured substrate and article, and the RTV material therebetween, are temporarily immersed in the liquid for on the order of at least 64 hours.

10. The method of coating at least one of two respective opposed surfaces of an electrical device and a substrate on which the electrical device is mounted to produce an electrical device-substrate assembly, which comprises:

flowing an RTV material having a viscosity on the order of 6–9 poise between the electrical device and the substrate;

immersing the electrical device-substrate assembly in a water bath having a volume of on the order of at least 10 milliliters of water for each cubic centimeter of the RTV material, for on the order of at least 16 hours under a hydrostatic head on the order of 3–4 inches, as the RTV material cures;

removing the substrate-electrical device assembly from the water bath;

air-drying the substrate-electrical device assembly; and heat-curing the RTV material.

11. The method as recited in claim 10, in which the electrical device-substrate assembly is immersed in the water bath for on the order of at least 64 hours.

* * * * *